US006812462B1

United States Patent
Toth et al.

(10) Patent No.: US 6,812,462 B1
(45) Date of Patent: Nov. 2, 2004

(54) DUAL ELECTRON BEAM INSTRUMENT FOR MULTI-PERSPECTIVE

(75) Inventors: Gabor D. Toth, San Jose, CA (US); John A. Notte, IV, Gloucester, MA (US); Richard A. Price, Mansfield, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/435,011

(22) Filed: May 9, 2003

Related U.S. Application Data

(60) Provisional application No. 60/449,372, filed on Feb. 21, 2003.

(51) Int. Cl.[7] ............................................... H01J 37/28
(52) U.S. Cl. ..................................................... 250/310
(58) Field of Search ........................................ 250/310

(56) References Cited

U.S. PATENT DOCUMENTS

| | | | |
|---|---|---|---|
| 4,417,203 A | 11/1983 | Pfeiffer et al. ................. | 324/51 |
| 4,420,686 A | * 12/1983 | Onoguchi et al. ........... | 250/310 |
| 4,472,631 A | 9/1984 | Enke et al. ................... | 250/281 |
| 4,686,566 A | 8/1987 | Bucher ........................ | 358/113 |
| 4,877,326 A | 10/1989 | Chadwick et al. ........... | 356/394 |
| 5,144,149 A | 9/1992 | Frosch ..................... | 250/493.1 |
| 5,412,209 A | 5/1995 | Otaka et al. ................. | 250/310 |
| 5,493,116 A | 2/1996 | Toro-Lira et al. ............ | 250/310 |
| 5,552,602 A | 9/1996 | Kakibayashi et al. ........ | 250/311 |
| 5,557,105 A | 9/1996 | Honjo et al. ................. | 250/310 |
| 5,734,164 A | 3/1998 | Sanford ........................ | 250/310 |
| 5,869,833 A | 2/1999 | Richardson et al. ......... | 250/310 |
| 6,038,018 A | 3/2000 | Yamazaki et al. ........ | 356/237.1 |

(List continued on next page.)

FOREIGN PATENT DOCUMENTS

| | | |
|---|---|---|
| DE | 3621045 A | 1/1987 |
| EP | 0266535 A | 5/1988 |

(List continued on next page.)

OTHER PUBLICATIONS

Veneklasen, Lee H., "The Continuing of Low–Energy Electron Microscopy for Characterizing Surfaces.", Dec. 1, 1992, Review Of Scientific Instruments, US, American Institute Of Physics. New York, vol. 63, No. 12, pp. 5513–5532.

(List continued on next page.)

*Primary Examiner*—Jack I. Berman
(74) *Attorney, Agent, or Firm*—Beyer, Weaver & Thomas LLP

(57) ABSTRACT

Method and apparatus for imaging at multiple perspectives of a specimen are disclosed. In one embodiment, an apparatus for generating a multi-perspective image using multiple charged particle beams (e.g., electron beams) is disclosed. In one embodiment, the apparatus generally includes a charged particle beam generator system arranged to generate and control a first charged particle beam directed substantially at a first angle towards the specimen and a second charged particle beam directed substantially at a second angle towards the specimen. The apparatus also includes an image generator arranged to generate one or more images based on charged particles emitted from the specimen in response to the first and second charged particle beams and a controller arranged to cause the charged particle beam generator to direct both the first charged particle beam and the second charged particle beam at a first area of the specimen. In a specific implementation, the charged particles are in the form of electrons and the apparatus is a dual electron beam scanning electron microscope (SEM).

16 Claims, 6 Drawing Sheets

U.S. PATENT DOCUMENTS

| | | | |
|---|---|---|---|
| 6,066,849 A | 5/2000 | Masnaghetti | 250/310 |
| 6,087,659 A | 7/2000 | Adler et al. | 250/310 |
| 6,091,249 A | 7/2000 | Talbot et al. | 324/751 |
| 6,172,363 B1 | 1/2001 | Shinada et al. | 250/310 |
| 6,566,655 B1 * | 5/2003 | Choo et al. | 250/310 |
| 6,586,733 B1 | 7/2003 | Veneklasen et al. | 250/306 |
| 6,627,884 B2 | 9/2003 | McCord et al. | 250/306 |
| 2004/0000642 A1 | 1/2001 | Veneklasen et al. | 250/311 |

FOREIGN PATENT DOCUMENTS

| | | | | |
|---|---|---|---|---|
| EP | 0417354 A | 3/1991 | | |
| EP | 0457317 A | 5/1991 | | |
| EP | 0594394 A | 4/1994 | | |
| EP | 0810629 A1 | 3/1997 | | H01J/37/28 |
| EP | 0853243 A2 | 7/1998 | | G01R/31/305 |
| EP | 0892275 A2 | 1/1999 | | G01R/31/307 |
| WO | WO02/49080 A1 | 6/2002 | | |

OTHER PUBLICATIONS

Ludwig Reimer, "Scanning Electron Microscopy, Physics of Image Formation and Microanalysis", 3.5.2 Charging of Insulating Specimens, pp. 119–123 (1985).

* cited by examiner

DUAL ELECTRON BEAM INSTRUMENT FOR MULTI-PERSPECTIVE

CROSS REFERENCE TO RELATED APPLICATIONS

This application claims priority of U.S. Provisional Patent Application No. 60/449,372, filed Feb. 21, 2003, which application is incorporated herein by reference in its entirety for all purposes.

BACKGROUND OF THE INVENTION

The present invention relates generally to feature imaging using scanning electron microscopy, and more specifically to apparatus and methods for enhancing image quality.

FIG. 1 is a diagrammatic representation of a conventional scanning electron microscopy configuration 100. As shown, a beam of electrons 102 is scanned over a specimen 104 (e.g., a semiconductor wafer). Multiple raster scans 112 are typically performed over a small area 114 of the specimen 104. The beam of electrons 102 either interact with the specimen and cause an emission of secondary electrons 106 or bounce off the specimen as backscattered electrons 106. The secondary electrons and/or backscattered electrons 106 are then detected by a detector 108 that is coupled with a computer system 110. The computer system 110 generates an image that is stored and/or displayed on the computer system 110.

Although conventional microscopy systems and techniques typically produce images having an adequate level of quality under some conditions, they produce poor quality images of the specimen under certain conditions. For example, conventional systems and techniques fail to produce images for certain specimen features. For example, the bottom of a contact or trench region is typically undifferentiated from the adjacent sidewalls of the contact or trench. Typically, both the bottom and sidewalls will appear dark because a significant number of the secondary electrons within the contact or trench hit the sidewalls and fail to escape from the contact or trench and reach the detector 108. As a result of this failure, the bottom and sidewall's individual dimensions and shapes are obscured within the resulting image.

Improved conventional systems provide multi-perspective imaging (e.g., of sidewalls and trenches) by providing multiple angles between the incident beam and the specimen. The multiple angles are typically provided by either tilting the stage on which the specimen is positioned relative to the electron beam or by tilting the electron beam column through which the incident electron beam is generated and directed towards the specimen relative to the specimen. In the first configuration, a first image is obtained from the sample when the specimen and stage are positioned at a first angle relative to the beam column, and a second image is obtained when the specimen and stage are positioned at a second angle relative to the beam column In the second configuration, a first image is obtained from the sample when the beam column is positioned at a first angle relative to the specimen, and a second image is obtained when the beam column is positioned at a second angle relative to the specimen.

Although these two configurations for obtaining multi-perspective imaging are adequate, they both have associated disadvantages. Specifically, both configurations require a high number of moving parts. That is, the first configuration requires movement mechanisms for accurately positioning the stage angle, while the second configuration requires movement mechanisms for accurately positioning the beam column angle. The movement mechanisms in either configuration are typically complex and expensive. Additionally, both configurations require constant monitoring and adjustment to ensure proper beam alignment relative to the specimen area of interest or an accurate stage position relative to the beam column.

Thus, improved microscopy apparatus and techniques for accurately and efficiently providing multiple perspective images are needed.

SUMMARY OF THE INVENTION

Method and apparatus for imaging at multiple perspectives of a specimen are disclosed. In one embodiment, an apparatus for generating a multi-perspective image using multiple charged particle beams (e.g., electron beams) directed at a specimen at multiple incident angles is disclosed. The apparatus generally includes a charged particle beam generator system arranged to generate and control a first charged particle beam directed substantially at a first angle towards the specimen and a second charged particle beam directed substantially at a second angle towards the specimen. The apparatus also includes an image generator arranged to generate one or more images based on charged particles emitted from the specimen in response to the first and second charged particle beams and a controller arranged to cause the charged particle beam generator to direct both the first charged particle beam and the second charged particle beam at a first area of the specimen. In a specific implementation, the charged particles are in the form of electrons and the apparatus is a dual electron beam scanning electron microscope (SEM).

In a preferred aspect, the controller is only operable to move the stage in a translational direction with respect to a surface of the specimen. In a specific embodiment, the first angle is about 90 degrees and the second angle is about 45 degrees. In another embodiment, the first angle is about 90 degrees and the second angle is about 30 degrees.

In a specific aspect, the controller is further operable to cause the charged particle beam generator system to direct the first charged particle beam towards the first area at a first time and to direct the second charged particle beam towards the first area at a second time that differs from the first time. In a further aspect, the apparatus also includes a first detector for detecting charged particles from the specimen in response to the first charged particle beam being directed towards the specimen and generating a first detected signal and a second detector for detecting charged particles from the specimen in response to the second charged particle beam being directed towards the specimen and generating a second detected signal. In this aspect, the image generator is operable to receive the first and second detected signals and use them to detect defects in the specimen.

In a specific implementation, the charged particle beam system is in the form of a first charged particle beam generator for directing the first charged particle beam towards the specimen and a second charged particle beam generator for directing the second charged particle beam towards the specimen. In a further aspect, the first and second charged particle beam generators are positioned to direct charged particle beams onto different areas of the specimen. The apparatus may further include a multiplexer coupled between the controller and the first and second charged particle beam generators, and the first and second charged particle beam generators are controlled independently by the controller through the multiplexer such that the first charged particle beam is directed towards a first area at a first time period and the second charged particle beam is directed towards the same first area at a second time period that differs from the first time period. The controller is further operable to move the specimen such that the first area is under the first charged particle beam during the first time period and under the second charged particle beam during the second time period.

In an alternative implementation, the charged particle beam system is in the form of a single beam generator for generating a single incident beam and a beam splitter for receiving and splitting the single incident beam into the first charged particle beam and the second charged particle beam and directing the first charged particle beam at the first angle and the second charged particle beam at the second angle towards the specimen.

In yet another implementation, the charged particle beam system is in the form of a first charged particle beam generator for generating the first charged particle beam towards the specimen, a second charged particle beam generator for generating the second charged particle beam towards the specimen, and a lens for receiving the first and second charged particle beams and directing them towards the specimen at a single area In one aspect, the first and second charged particle beam generators are integrated together along with the lens.

In an alternative embodiment, the invention pertains to a method of generating an image of a specimen with a scanning electron microscope (SEM) having an electron beam generator for directing a first electron beam substantially towards the specimen at a first angle relative to a surface of the specimen and for directing a second electron beam substantially towards the specimen at a second angle relative to a surface of the specimen, at least one detector for detecting electrons that are emitted from the specimen, and an image generator for generating the image of the specimen from the emitted electrons. A first incident electron beam is directed towards a first area of the specimen at the first angle. Without tilting the specimen relative to the beam generator, a second incident electron beam is directed towards the first area of the specimen at the second angle. The first angle differs from the second angle. One or more images are then generated based on electrons detected by the at least one detector in response the first and second incident beams.

In one specific implementation, the first incident beam and the second incident beam are directed towards the first area during different time periods. In a further aspect, the specimen is moved relative to the beam generator such that the first area is below the first incident beam during the first time period and the first area is below the second incident beam during the second time period. That is, the specimen or the beam generator is moved. In one example, the specimen is moved translationally. In another aspect, the first incident beam and the second incident beam are directed towards the first area during a same time period.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the specific embodiments of the invention. Examples of the these specific embodiments are illustrated in the accompanying drawings. While the invention will be described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, a multiple charged particle beam system is provided for generating one or more images of a specimen at multiple angular perspectives. In one example implementation, the charged particle beam system is a dual scanning electron microscope (SEM) which provides two electron beam (e-beams) incident upon a specimen. In one embodiment, the SEM includes an e-beam generator system operable to direct a first e-beam at a first angle towards a first area of the specimen and to direct a second e-beam at a second angle towards the same area of the specimen. In one example, the first e-beam is 90 degrees from the surface of the specimen, and the second e-beam is about 45 degrees from the surface of the specimen. In other implementations, the second e-beam has a 30 degrees angle relative to the specimen surface. Several implementation examples of e-beam generator systems are further described below with respect to FIGS. 2A through 6.

Although the following description is mainly directed towards multiple e-beam systems, of course, other types of charged particle beam systems may be easily modified to include multiple beams for defect detection or for other purposes. Alternatively, a multiple focused ion beam system may be utilized. Additionally, although the following example implementations are described as having two e-beams, of course, a greater number of e-beams may be utilized at a greater number of incident angles so as to enhance detection of defects or for other purposes. Furthermore, the systems are not limited to the two angles (90 and 45) disclosed herein with respect to the dual e-beam systems, and any two or more angles may be utilized to satisfy the particular requirements of the imaging, review, or inspection application.

Figure 1:
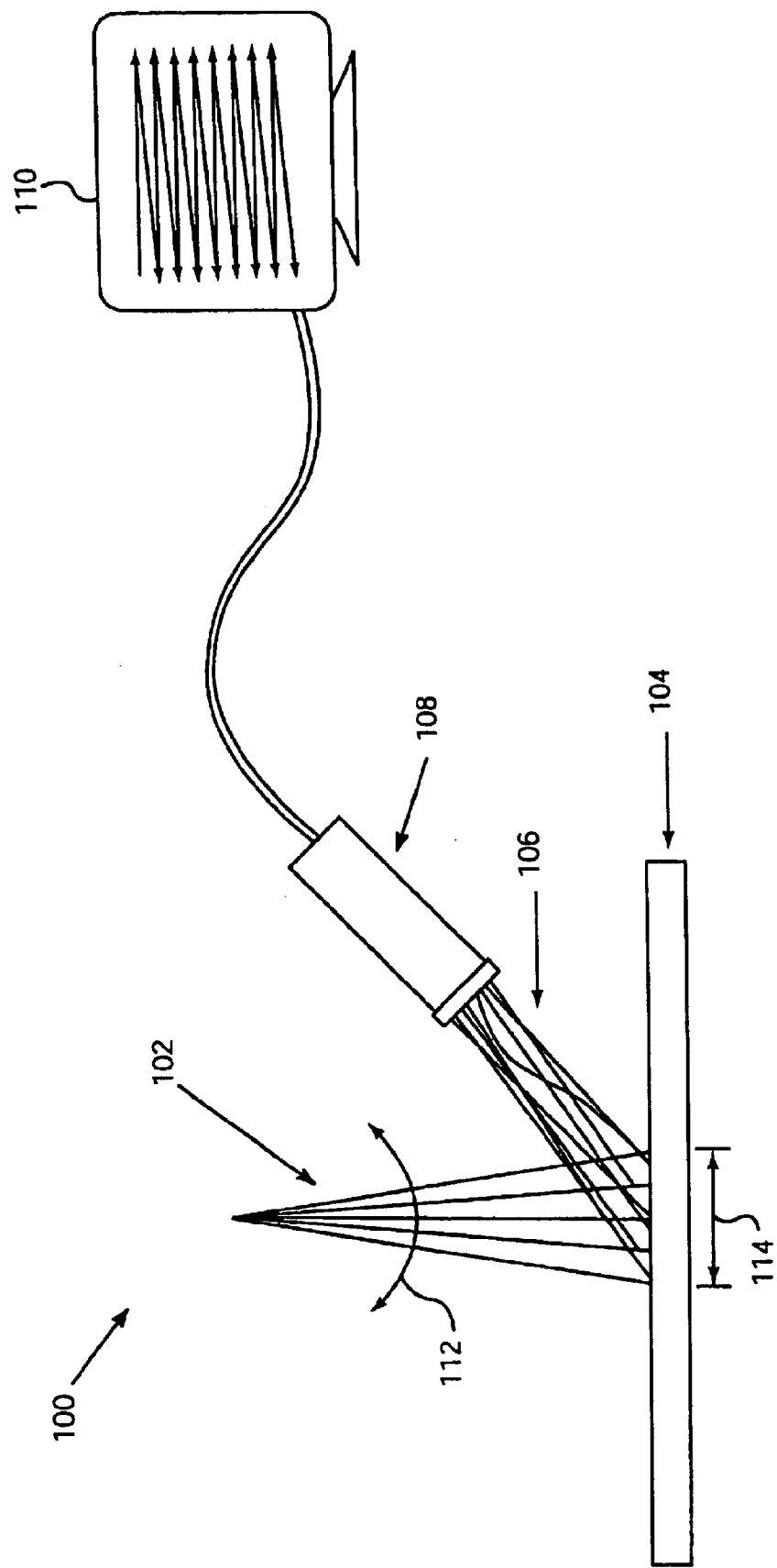
FIG. 1 is a diagrammatic representation of a conventional scanning electron microscopy configuration.
Figure 2A:
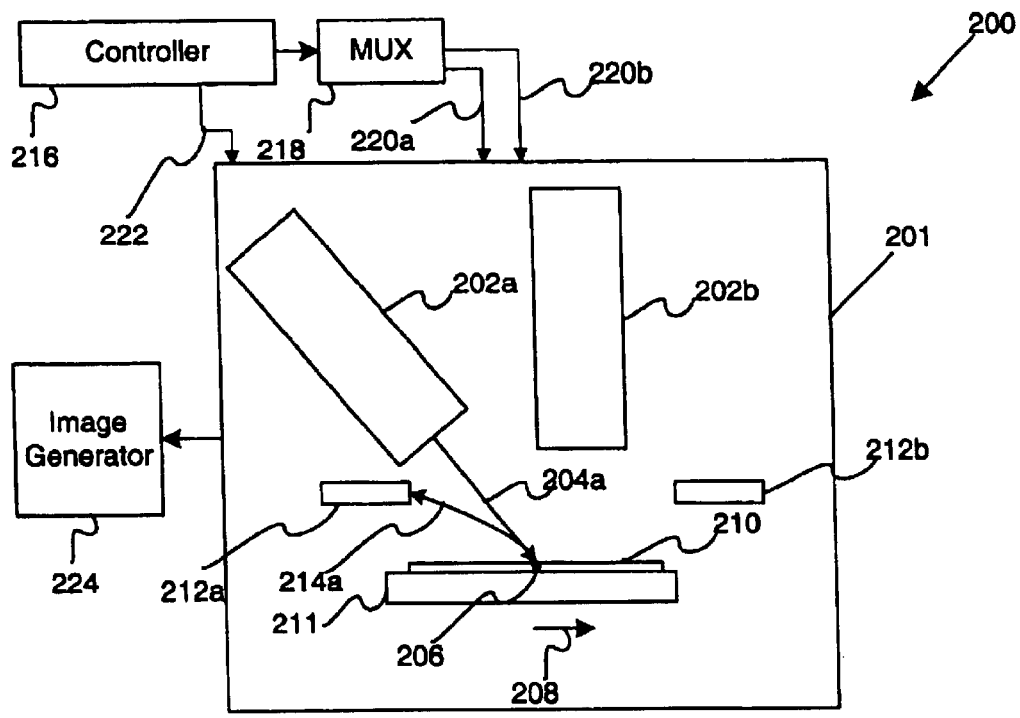
FIGS. 2A and 2B are each a diagrammatic representation of a dual e-beam system in accordance with a first embodiment of the present invention.
Figure 2B:
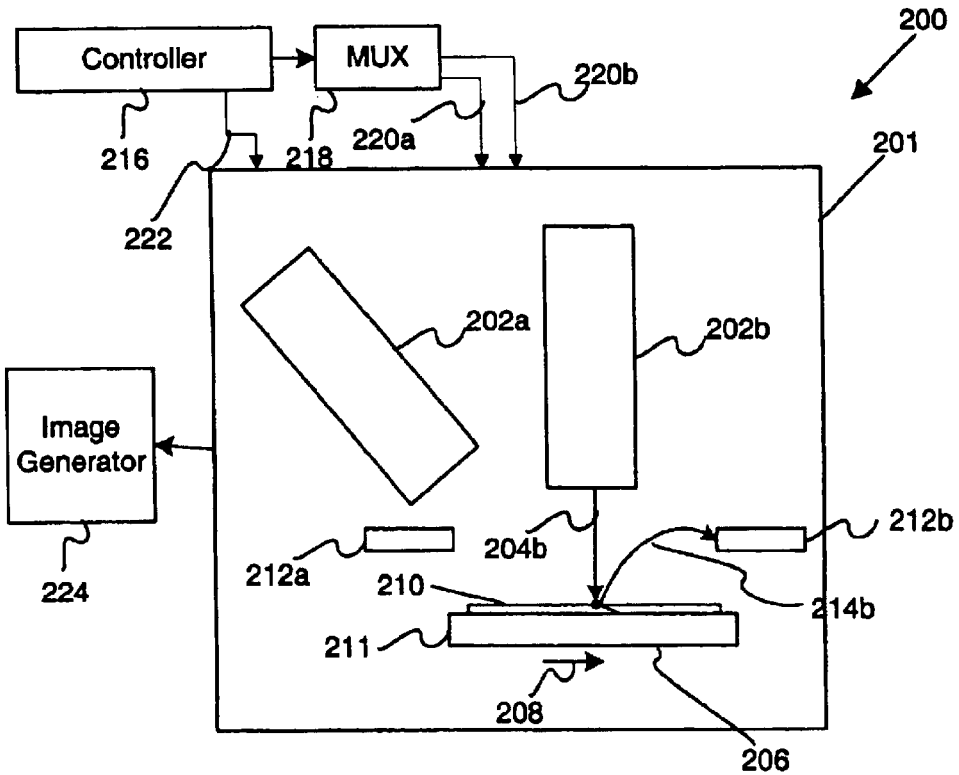

FIGS. 2A and 2B are each a diagrammatic representation of a dual e-beam system 200 in accordance with a first embodiment of the present invention. In this implementation, the e-beam generator system is in the form of a first e-beam generator 202a and a second e-beam generator 202b contained within vacuum chamber 201. Each e-beam generator 202 may be controlled independently by controller 216 through multiplexer 218 which outputs a first control signal 220a to the first beam generator 202a and a second control signal 220b to the second beam generator 202b.

The controller 216 is also operable to initiate movement of a stage 211 which holds the specimen 210 thereon. In the present invention, the controller and stage only need to be configured to move in a translational direction within a same plane, such as moving in an x and/or a y direction, not in a rotational or tilting direction. In other words, the specimen doesn't have to be tilted at an angle relative to the beam nor does the beam's angle have to be moved relative to the sample since two fixed beam angles are already provided. In one embodiment, the controller also includes a stage servo and interferometers for controlling the position and movement of the stage 211. While the stage 211 is moving in the x-direction, for example, one of the beam generators 202 can be repeatedly deflected back and forth in the y direction to raster or scan across an area of the specimen. The controller 216 also directs the movement of the stage so that a same area of the specimen is scanned by the two e-beams 204 (at different times).

By way of illustration, the controller 216 sends a control signal to the multiplexer 218 which indicates that the first beam generator is to turn on during a first time period (while the second generator 202b is left off) and the second beam generator 202b is to turn on during a second time period (and the first beam generator 202a is to turn off). In response to the output signal from the controller 216, the multiplexer 218 sends a first output signal to the first beam generator 202a instructing it to direct a first incident beam 204a towards specimen 210 onto scan spot 206 during the first time period as shown in FIG. 2A. The multiplexer 218 also sends a second output signal to the second beam generator 202b instructing it to direct a second incident beam 204b towards specimen 210 onto the same scan spot 206 during the second time period as shown in FIG. 2B. The controller 216 also directs the stage 211 to move the specimen so that scan spot 206 is under the first incident beam 204 during the first time period and under the second incident beam 204b during the second time period.

The controller is operable to set or adjust the operation of the beam generators via control signals sent through multiplexer 218. By way of example, the control signals may include a gun lens voltage and x and y tilt voltages for controlling each beam current density, x and y scan voltages for controlling a scan pattern of each beam, and a support bias voltage for controlling landing energy of each beam. Landing energy is defined as the energy at which a beam hits the specimen. It should be well understood that a "tilt voltage" is a deflection voltage and may include tilt deflection and/or shift deflection.

The first beam generator 202a is mounted such that it directs an incident beam 204a at about 45 degree angle relative to the sample surface 210. Alternatively, the first beam generator 202a may be positioned at about a 30 degree angle relative to the sample surface 210. The second beam generator 202b is mounted such that it may direct an incident beam 204b towards the sample 210 at about a 90 degree angle relative to the sample surface.

In response to the first incident beam 204a, secondary and/or backscattered electrons 214a are emitted from the sample 210 and impinge on detector 212a. The detector 212a is generally operable to convert the detected electrons to a first detected signal which is output to image generator 224. The image generator 224 may generate an image corresponding to the first detected signal. After the sample 210 is imaged with the first incident beam 204a, the sample may be moved in direction 208 such that scan spot 206 is positioned directly below the second beam generator 202b as shown in FIG. 2B. In response to the second incident beam 204b, secondary and/or backscattered electrons 214b are emitted from the sample 210 and impinge on detector 212b. The detector 212b is generally operable to convert the detected electrons to a second detected signal which is output to image generator 224, which then may generate an image based on the second detected signal. The detected signals from the two detectors 212a and 212b may also be processed to detect defects within the sample 210. The detectors 212 may be located in any suitable position for detecting electrons emitted from the sample.

The controller 216 may alternatively be configured to direct both the first and second e-beams towards different scan spots at the same time, as opposed to time multiplexing the two e-beams to be directed towards a same spot. However, in this implementation, the controller 216 is operable to move the stage and specimen so that the same spots are eventually imaged by the two e-beams. Specifically, the first e-beam may be directed towards a first scan spot while the second e-beam is directed towards a second scan spot. The stage is then moved one or more times so that the first e-beam is directed toward the second scan spot and the second e-beam is directed towards the first scan spot. The electrons emitted from each scan spot in response to the each e-beam may then be processed to detect defects within the scan spots.

Each beam generator of FIGS. 2A and 2B may be designed to have different imaging applications. In one aspect, the 90 degree beam generator provides high speed imaging for review applications and an e-beam with sufficient energy for material analysis, while the 45 degree beam generator provides perspective imaging. In these two different applications, the 90 degree beam generator has landing energies of up to about 20,000 keV, while the 45 degree beam generator is capable of landing energies of up to about 2,000 keV. Although this would be the preferred arrangement, the 45 degree beam generator may have the higher energy column, while the 90 degree beam generator has the lower energy. In these two applications, both the 90 degree and 45 degree beam generators utilize a high efficiency through-the-lens detector or spectrometer for imaging.

In one embodiment, the 90 degree beam generator is capable of high resolution (e.g., 2~3 nm) and of performing CD (critical dimension)-type measurements, while the 45 degree beam generator can provide perspective imaging. In one implementation, the 90 degree beam generator uses a high resolution radial immersion lens and the 45 degree generator uses an axial lens. In other embodiments, the 45 degree generator has an associated X-ray detector, such as a EDS (energy dispersive spectroscopy) or a WDS (wavelength dispersive spectroscopy) detector, for detecting X-rays emitted from the sample in response to the high energy 45 degree incident e-beam.

A multiple angled e-beam system provides several advantages. For example, a large angled abeam (e.g., 45 degrees) may be utilized to image three dimensional structures, such as sidewalls, and grains. In alternative embodiment, a lower angled e-beam (e.g., 0–10 degrees with electronic tilt) may be used to image a high aspect ratio structure, such as a contact hole, and a high angle fixed tilted e-beam can be used for sidewall imaging. The multiple angle e-beam system of the present invention reduces complexity in setting up the system because it facilitates use of a single recipe for the single system and multiple-angle imaging in a single pass. This ease of use may also facilitate classification of multi-perspective imaged defects.

Figure 3A:
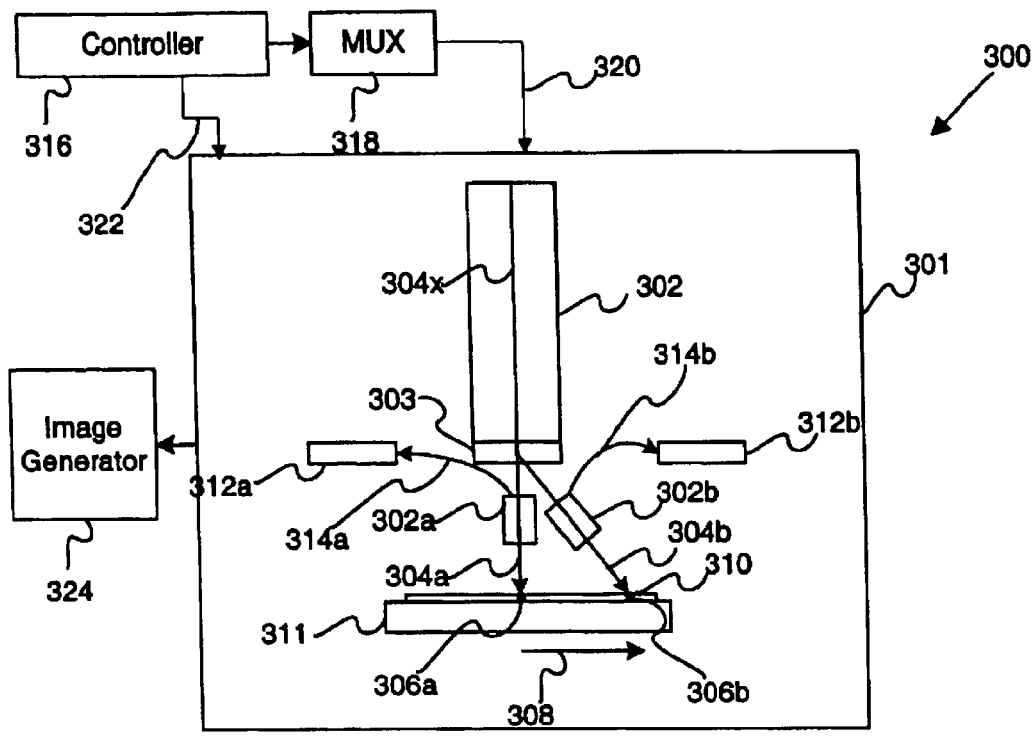
FIGS. 3A and 3B are each a diagrammatic illustration of a second embodiment of a dual beam system.
Figure 3B:
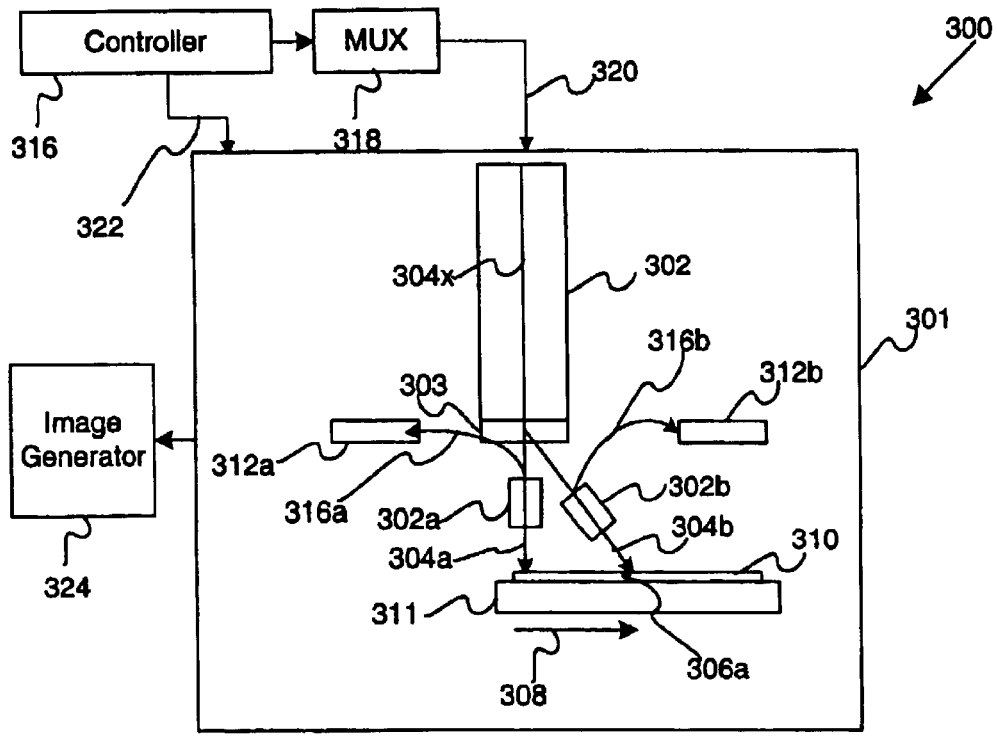

FIGS. 3A and 3B are each a diagammatic illustration of a second embodiment of a dual beam system 300. In this implementation, the e-beam generator system is in the form of a single beam generator 302 which generates a single incident beam 304x directed through a beam splitter 303. The beam splitter 303 splits the single incident beam 304x and outputs a first beam 304a at about a 90 degree angle relative to the sample surface 310 and a second beam 304b at about a 45 degree angle relative to the sample surface 310. Specifically, beam 304a is directed onto scan spot 306a and beam 304b is directed onto a different scan spot 306b.

This system also includes a first detector 312a and a second detector 312b which can have a similar operation as the detectors of FIGS. 2A and 2B. In this implementation, the controller may be operable to control generation and output of detected signals from the two detectors 312a and 312b. Preferably, the controller operates (through multiplexer 318) to output only one detected signal from one of the detectors 312 to generate an image of a single scan spot. For instance, the detected signal from detector 312b is output to image generator 324 when the e-beam 304b is being directed towards scan spot 306b. The detected signal from detector 312a is then output to image generator 324 when the e-beam 304a is being directed towards scan spot 306b (after the specimen is moved as shown in FIG. 3B). Additional detectors may be located at the lower section of the column.

Since two e-beams are produced, the controller may be operable to generate an image from each scan spot 306a and 306b (without multiplexing the output of the detected signals from the two detectors). That is, a first image is generated from detected electrons 314a from scan spot 306a, and a second image is generated from the detected electrons 314b from scan spot 306b. After the images are generated, the stage and specimen may be moved in direction 308, for example, so that scan spot 306a is imaged with incident beam 304b which is at about a 45 degree angle as shown in FIG. 3B. The images produced from both incident beams may be analyzed to defect defects in scan spot 306a The stage and specimen may be moved again so that scan spot 306b is imaged with incident beam 304a and combined with the image produced by incident beam 304b.

Figure 4:
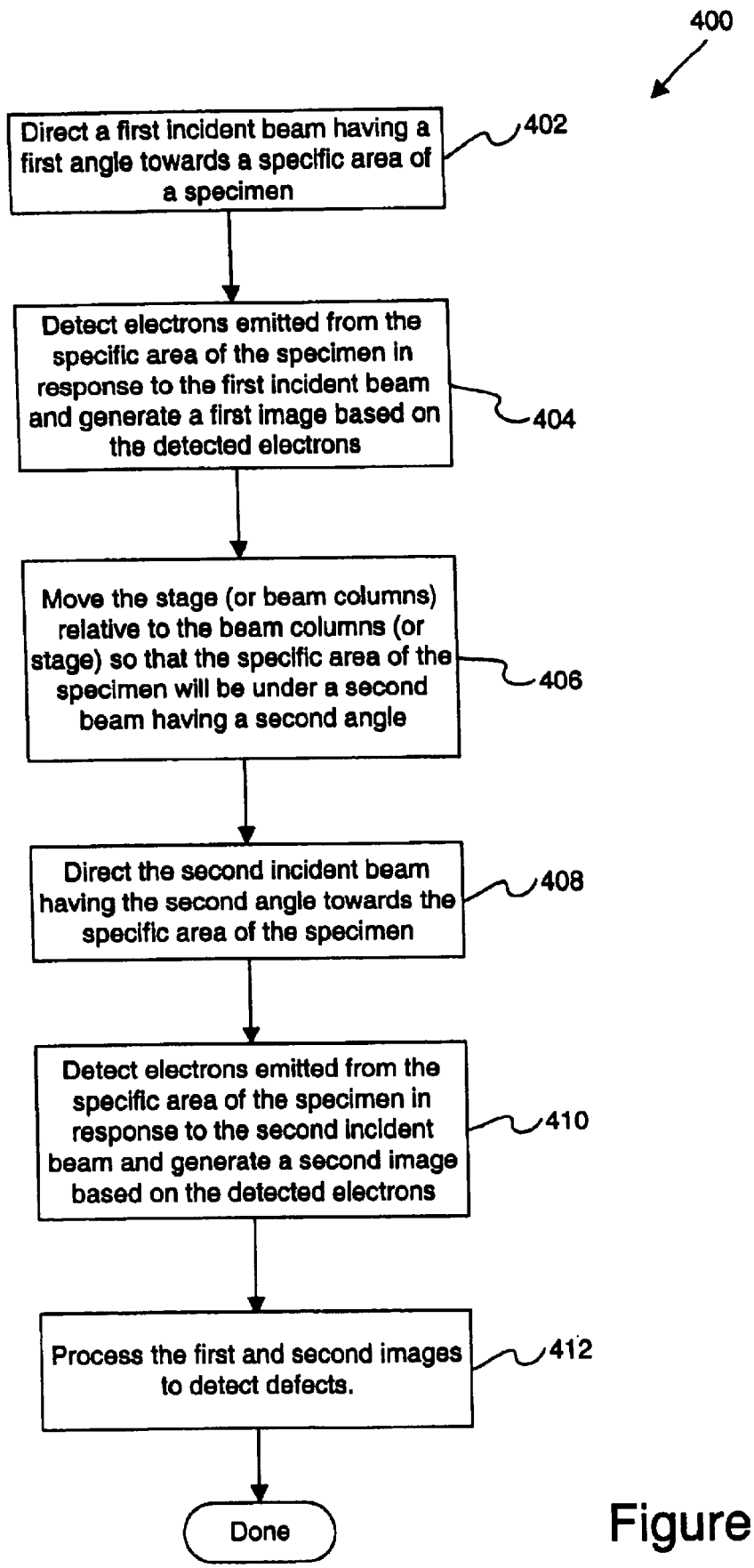
FIG. 4 is a flowchart illustrating a procedure for utilzing a dual beam system in accordance with one embodiment of the present invention.

FIG. 4 is a flowchart illustrating a procedure 400 for utilizing a dual beam system in accordance with one embodiment of the present invention. By way of example, this technique may be utilized for the e-beam systems of FIGS. 4A through 3B. Initially, a first incident e-beam is directed towards a specific area of a specimen in operation 402. Electrons emitted from the specific area of the specimen are then detected in response to the first incident beam and a first image may be generated based on the detected electrons in operation 404.

The stage (or beam columns) is then moved translationally relative to the beam columns (or stage) so that the specific area of the specimen is under the second beam generator in operation 406. The stage and specimen do have to be tilted since two beams are provided at two different angles. However, tilting of the specimen may be used in particular applications, e.g., when other angles in addition to the e-beam beam column angles are required. A second incident beam having a second angle is then directed towards the specific area of the specimen in operation 408. Electrons emitted from the specific area of the specimen in response to the second incident beam are then detected and a second image may then be generated based on the detected electrons in operation 410.

The images generated from the first and second incident beams may then be processed to detect defects in the specific area in operation 412. Particular types of defects may be more easily found with a selected one of the two different beams. Since some defects cannot be seen from a top down direction, defects may be detected using the tilted beam. Side wall problems are defects which may be more easily detected with a tilted beam. Other types of defects are not visible with a tilted beam and require a 90 degrees beam. Accordingly, the differently angled beams of the present invention provide the best information possible for defect detection.

Figure 5:
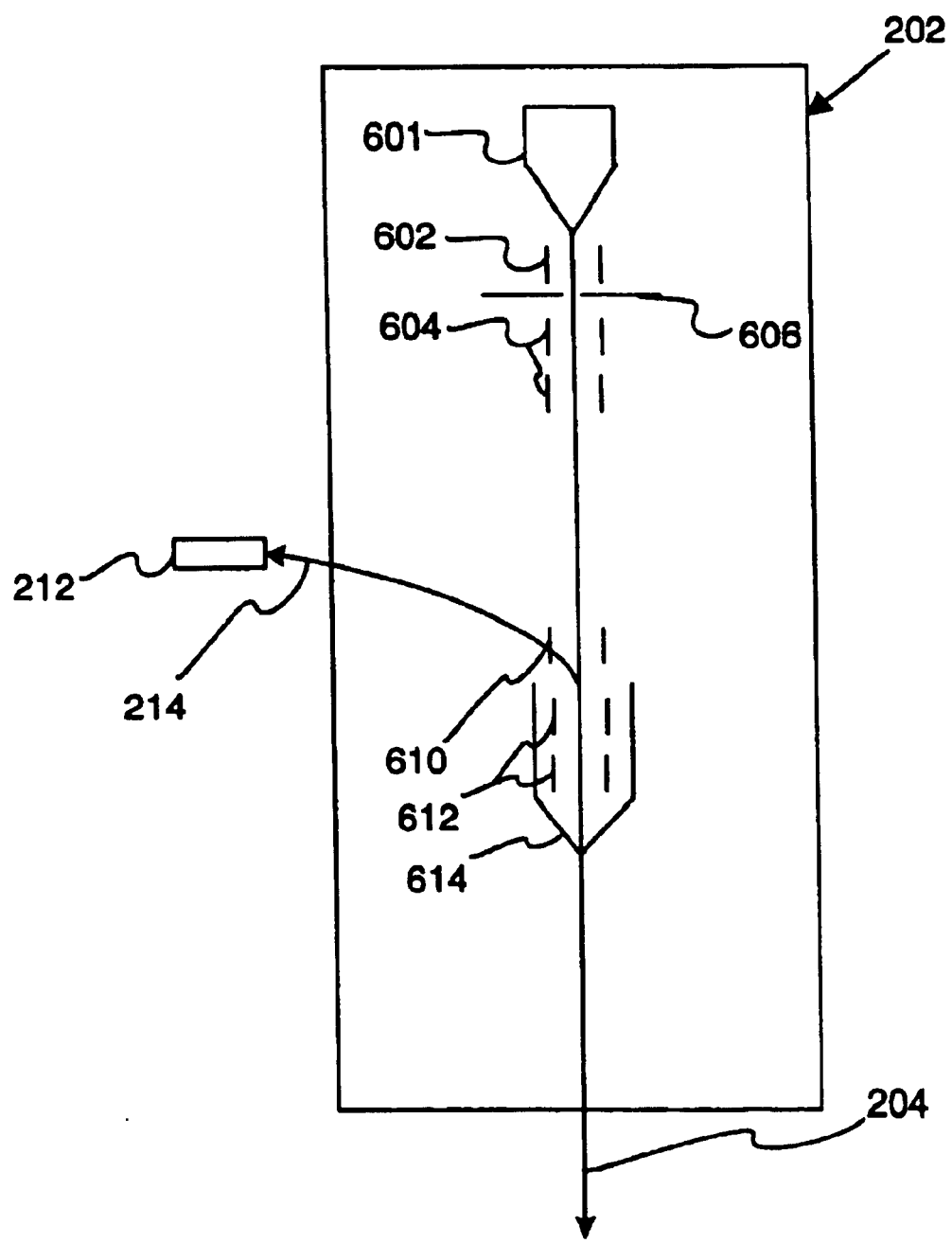
FIG. 5 is a detailed diagrammatic representation of one of the beam generators of FIG. 2 in accordance with one embodiment of the present invention.

FIG. 5 is a detailed diagrammatic representation of one of the beam generators 202 of FIG. 2, respectively, in accordance with one embodiment of the present invention. As shown, each beam generator includes a source 601 for producing electrons 204. The source 601 may be implemented in any suitable form for generating and emitting electrons. For example, the source 601 may be in the form of a filament that is heated such that electrons within the filament are excited and emitted from the filament.

The electron beam is output from source 601 through beam alignment elements 602. The beam alignment elements 602 may be in the form of upper and lower quadrupoles. The upper quadrupole may be configured to align the beam after a particular gun lens voltage is selected. In other words, the beam may have to be moved such that it is realigned with respect to the aperture. This realignment is accomplished by supplying an X and Y tilt signal from the controller. Thus, to select a beam current density, three image control signals may be provided from the controller. That is, the cross-over point's distance from the aperture may be selected by setting the gun lens voltage that is supplied to the lens 604, and the beam may be realigned with respect to the aperture by setting the X and Y tilt voltage values that are supplied to the upper quadrupole.

The lower quadrupole may be included to compensate for mechanical alignment discrepancies. That is, the lower quadrupole may be used to adjust the alignment of the beam with respect to any misaligned through-holes of the SEM through which the beam must travel.

After passing through the alignment elements 602, the electron beam then continues through aperture 606 and through one or more condenser lens 604. The lens 604 may have any suitable configuration for directing the electrons toward the specimen. For example, it may be in the form of one or more electrodes. Each electrode has a hole around which field lines are generated that produce a lensing effect and converges the electron beam into a particular cross-over or focal point. The field line's strength and resulting position of the cross-over point depend on the value of the gun lens voltage that is provided by the controller (e.g., 216 of FIG. 2A).

The beam generator may also include a suppressor (not shown) for inhibiting spurious electrons that deviate from a direct path to the specimen. For example, the suppressor may include a hole around which a negative potential is generated to repel the electrons to follow a trajectory that is substantially through a center of the hole.

The beam generator 202 may also include an extractor (not shown) arranged in any suitable configuration for generating a large positive potential field to slow down the beam electrons and accelerate the secondary electrons away from the specimen. For example, the extractor may be in the form of a large positive electrode for accelerating the beam electrons through a hole in the extractor, wherein an extraction field is thrown out from the hole towards the specimen, which field causes the beam electrons to slow down. In contrast, the extraction field causes any secondary electrons that reach it to accelerate away from the specimen. The extractor may also include a beam stop aperture for selecting beam electrons with a small angle with respect to a longitudinal axis through the hole of the extractor.

The electron beam is then passed through a Wien filter 610. The Wien filter 610 provides a B×E field (e.g., a magnetic field's direction is perpendicular and directed away from a direction of an electric field) that is normal to the electron beam is path. The Wien filter 610 applies an E force on the beam that is opposite to the B force that is applied on the beam. Thus, the Wien filter does not substantially move the beam off axis. However, the Wien filter 610 applies the E force and B force on secondary electrons emitted from the specimen in a same direction that is towards the detector 212. Thus, the Wien filter 610 deflects secondary electrons towards the detector 212. The electron beam then passes through scanning elements 612. The scanning elements may take any suitable. In one implementation, the scanning elements are in the form of a lower octupole configured to direct the beam across an area of the specimen. By setting the X and Y scan voltages, a particular beam pattern may be selected. After passing through the scanning elements 612, the electron beam is then output by objective lens 614 as incident beam 204.

The e-beam system may include an energy filter and ground mesh and/or a scintillator (not shown) used in conjunction with the detector 212 . The energy filter and ground mesh may be arranged to select between secondary and backscattered electrons. If a high negative potential is applied to the energy filter, it is likely that backscattered electrons will only reach the detector 212 since backscattered electrons typically have a much higher eV value than the secondary electrons. The scintillator is arranged to accelerate the electrons that make it past the energy filter and ground mesh towards the detector 212. For example, the scintillator may be charged to a large positive potential, such as 5000 volts.

Figure 6:
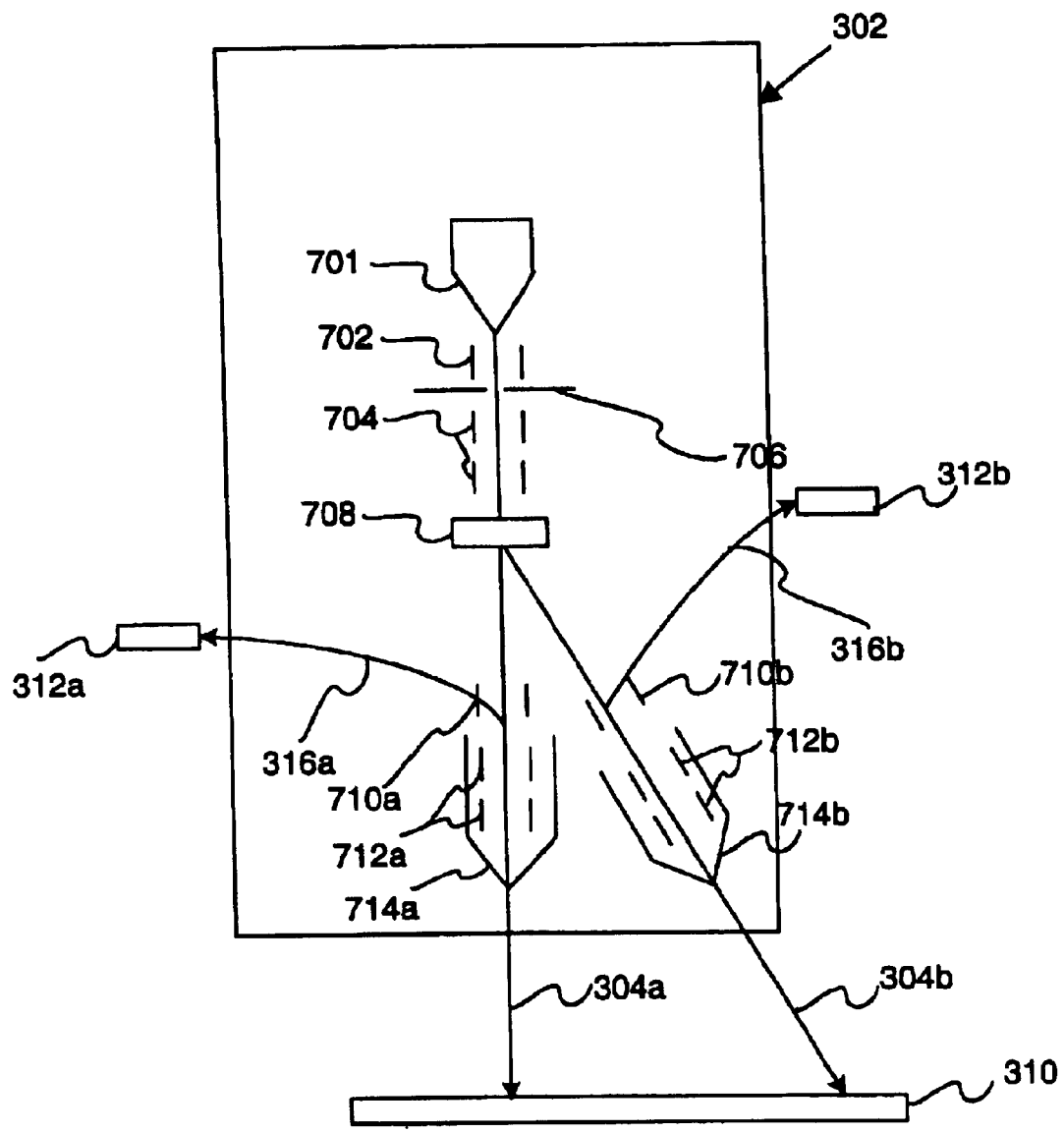
FIG. 6 is a diagrammatic representation of the beam generator of FIG. 3 in accordance with one embodiment of the present invention.

FIG. 6 is a diagrammatic representation of the beam generator 302 of FIG. 3 in accordance with one embodiment of the present invention. Similar to the beam generator of FIG. 5, the beam generator of FIG. 6 includes a source 701, beam alignment elements 702, an aperture 706, and one or more condenser lenses 704. Additionally, the beam generator 302 includes a beam splitter 708. The beam splitter 708 produces the first incident beam 304a and the second incident beam 304b. The beam splitter may be any suitable component for splitting a beam into two angles relative to a specimen surface. By way of examples, the beam splitter is a Wien, α or Ω filter which can switch between two beam directions.

The first incident beam 304a passes through Wien filter 710a The first incident beam 304a then passes through scanning element 712a and objective 714a onto specimen 310. In contrast, the second incident beam 304b passes through Wien filter 710b, scan elements 712b, and objective 714b onto specimen 310. Since in this implementation both beams are operating at the same time, the electric fields produced by the different elements of this beam generator 302 will require adjustment, e.g., via a calibration procedure.

Although the invention has been described as being implemented on the e-beam systems of FIGS. 2A through 3B and 5 through 6, of course another e-beam system may be implemented. By way of example, the source may expel electron at an eV that is substantially equal to the final landing energy value, and the electrons are then accelerated through a series of lens that are set at large positive potentials. As the electrons are expelled from the series of lens, the electrons then slow down and hit the specimen at the final landing energy. The series of lenses may throw out a large extraction field out of the objective lens, which acts to decelerate the electron beam, while accelerating the secondary electrons that are emitted from the specimen Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the specimen may be any substance or object that is suitable for SEM inspection or review, such as a semiconductor wafer or reticle. By way of a final example, the present invention may be especially useful in inspecting or reviewing wafers , which are being designed with smaller and smaller dimensions. Accordingly, the present embodiments are to be considered as illustrative and not restrictive, and the invention is not to be limited to the details given herein, but may be modified within the scope and equivalents of the appended claims.

What is claimed is:

1. An apparatus for generating an image from a specimen, comprising:

a charged particle beam generator system arranged to generate and control a first charged particle beam directed substantially at a first angle towards the specimen and a second charged particle beam directed substantially at a second angle towards the specimen;

an image generator arranged to generate one or more images based on charged particles emitted from the specimen in response to the first and second charged particle beams; and a controller arranged to cause the charged particle beam generator to direct both the first charged particle beam and the second charged particle beam at a first area of the specimen, wherein the controller is further operable to cause the charged particle beam generator system to direct the first charged particle beam towards the first area at a first time and to direct the second charged particle beam towards the first area at a second time that differs from the first time.

2. An apparatus as recited in claim 1, wherein the first and second charged particles beams and the charged particles emitted from the specimen comprise electrons.

3. An apparatus as recited in claim 1, the charged particle beam system comprising:

a first charged particle beam generator for directing the first charged particle beam towards the specimen; and a second charged particle beam generator for directing the second charged particle beam towards the specimen.

4. An apparatus as recited in claim 3, wherein the first and second charged particle beam generators are positioned to direct charged particle beams onto different areas of the specimen, the apparatus further comprising a multiplexer coupled between the controller and the first and second charged particle beam generators, wherein the first and second charged particle beam generators are controlled independently by the controller through the multiplexer such that the first charged particle beam is directed towards a first area at a first time period and the second charged particle beam is directed towards the same first area at a second time period that differs from the first time period, the controller further being operable to move the specimen such that the first area is under the first charged particle beam during the first time period and under the second charged particle beam during the second time period.

5. An apparatus as recited in claim 1, further comprising:
  a first detector for detecting charged particles from the specimen in response to the first charged particle beam being directed towards the specimen and generating a first detected signal; and
  a second detector for detecting charged particles from the specimen in response to the second charged particle beam being directed towards the specimen and generating a second detected signal,
  wherein the image generator is operable to receive the first and second detected signals and use them to detect defects in the specimen.

6. An apparatus as recited in claim 1, wherein the controller is operable to move the stage in a translational direction.

7. An apparatus as recited in claim 1, wherein the first angle is about 90 degrees and the second angle is about 45 degrees.

8. An apparatus as recited in claim 1, wherein the first angle is about 90 degrees and the second angle is about 30 degrees.

9. An apparatus as recited in claim 1, the charged particle beam system comprising:
  a single beam generator for generating a single incident beam; and
  a beam splitter for receiving and splitting the single incident beam into the first charged particle beam and the second charged particle beam and directing the first charged particle beam at the first angle and the second charged particle beam at the second angle towards the specimen.

10. An apparatus as recited in claim 1, the charged particle beam system comprising:
  a first charged particle beam generator for generating the first charged particle beam towards the specimen;
  a second charged particle beam generator for generating the second charged particle beam towards the specimen; and
  a lens for receiving the first and second charged particle beams and directing them towards the specimen at a single area.

11. An apparatus as recited in claim 10, wherein the first and second charged particle beam generators are integrated together along with the lens.

12. A method of generating an image of a specimen with a scanning electron microscope (SEM) having an electron beam generator for directing a first electron beam substantially towards the specimen at a first angle relative to a surface of the specimen and for directing a second electron beam substantially towards the specimen at a second angle relative to a surface of the specimen, at least one detector for detecting electrons that are emitted from the specimen, and an image generator for generating the image of the specimen from the emitted electrons, the method comprising:
  directing a first incident electron beam towards a first area of the specimen at the first angle;
  without tilting the specimen relative to the beam generator, directing a second incident electron beam towards the first area of the specimen at the second angle, wherein the first angle differs from the second angle, wherein the first incident beam and the second incident beam are directed towards the first area during different time periods; and
  generating one or more images based on electrons detected by the at least one detector in response the first and second incident beams.

13. A method as recited in claim 12, further comprising moving the specimen relative to the beam generator such that the first area is below the first incident beam during the first time period and the first area is below the second incident beam during the second time period.

14. A method as recited in claim 13, wherein the specimen is moved translationally.

15. A method as recited in claim 13, wherein the specimen is moved.

16. A method as recited in claim 13, wherein the beam generator is moved.

* * * * *

UNITED STATES PATENT AND TRADEMARK OFFICE
CERTIFICATE OF CORRECTION

PATENT NO. : 6,812,462 B1
DATED : November 2, 2004
INVENTOR(S) : Toth et al.

It is certified that error appears in the above-identified patent and that said Letters Patent is hereby corrected as shown below:

Column 6,
Line 10, change "202bas shown" to -- 202b as shown --.
Line 66, change "angled abeam" to -- angled e-beam --.

Column 8,
Line 4, change "e-beam beam column" to -- e-beam column --.

Signed and Sealed this

Twenty-sixth Day of April, 2005

JON W. DUDAS
*Director of the United States Patent and Trademark Office*